United States Patent [19]

Rebjock et al.

[11] Patent Number: 4,625,102

[45] Date of Patent: Nov. 25, 1986

[54] MEMORY CARD MANUFACTURING METHOD AND CARDS THUS OBTAINED

[75] Inventors: Alain Rebjock, Cergy; René Rose, Voisins Le Bretonneaux, both of France

[73] Assignee: Flonic, Montrouge, France

[21] Appl. No.: 618,291

[22] Filed: Jun. 7, 1984

[30] Foreign Application Priority Data

Nov. 29, 1983 [FR] France ............................. 83 18993
Jun. 9, 1984 [FR] France ............................. 83 09558

[51] Int. Cl.[4] .................................................. G06K 19/06
[52] U.S. Cl. ..................................... 235/492; 235/488; 219/243; 425/517; 425/DIG. 13
[58] Field of Search ............... 235/488, 492; 219/243; 425/517, DIG. 13, DIG. 245

[56] References Cited

U.S. PATENT DOCUMENTS

| | | | |
|---|---|---|---|
| 4,356,052 | 10/1982 | Moraw et al. ................. | 219/243 X |
| 4,380,699 | 4/1983 | Monnier et al. .................... | 235/492 |
| 4,463,971 | 8/1984 | Hoppe et al. ................... | 235/488 X |
| 4,483,067 | 11/1984 | Parmentier ..................... | 235/492 X |

OTHER PUBLICATIONS

Electronique Industrielle, #15, May, 1981 (France), "Electronic Payment Card: LEP Version", pp. 87–88.
Electronique, #279, Feb. 1980 (Paris), "Multiple Microprocessors in a Credit Card", pp. 11–12.

*Primary Examiner*—David L. Trafton
*Attorney, Agent, or Firm*—Dale Gaudier

[57] ABSTRACT

A method of manufacturing a memory card comprises taking an electronic module, which includes an insulating substrate and an integrated circuit, and locally raising the temperature of the plastic material of the card to its softening point. The module is then applied, with pressure, on one side of the card at its softened location to embed the module in the plastic material.

12 Claims, 13 Drawing Figures

MEMORY CARD MANUFACTURING METHOD AND CARDS THUS OBTAINED

BACKGROUND OF THE INVENTION

This invention relates to portable memory cards of the type containing an integrated circuit, and notably to the manufacture of such cards by an economical method.

The invention is applicable more precisely to prepayment cards, i.e. to cards to which is initially assigned a certain monetary value, the purchase of a card by the payment of this value making it possible to obtain certain services by successive cancellations or changes of state in memory elements assigned a unit value until the total value of the card is used up.

The prior art has already proposed, for the procurement of services, for example telephone calls, the use of an electronic-type memory card in which the memory is made up of elements which, as the card is used, are successively changed over from an intial state to a second state in an irreversible manner, the card becoming unusable when all the elements of its memory have gone over to the second state. As the card is not rechargeable, i.e. as the elements of its memory cannot be brought back to their initial state, it must be discarded. It is consequently important for its cost to be as low as possible in order to minimize the value of the consumable material.

There are known methods for the manufacture of electronic memory cards of standard format, according to which the integrated circuit is placed in a cavity which is provided in the card and which is then filled, totally or partially, with a coating material, and then closed by a thin sheet leaving visible only the metallic areas for the connection of the integrated circuit to a device exchanging data with the card. These methods generally involve a large number of delicate operations, such as: preparation of a cavity and of an integrated circuit module mounted on a suitable support, coating of the assembly and closing of the cavity, final pressing and routing of the card. Such methods are too costly to be applied to the manufacture of cards designed to be discarded after use.

SUMMARY OF THE INVENTION

It is thus an object of the invention to provide a manufacturing method making it possible to obtain memory cards economically and requiring only a limited number of operations.

The method provided by the invention for the manufacture of memory cards of the type including an integrated circuit embedded in a plastic material constituting the support of the card comprises the following steps:

An electronic module is provided which includes an insulating substrate equipped with metal-plated contact areas placed on a first side of said substrate, and an integrated circuit mounted on a second side of said substrate, said module having a thickness smaller than the thickness of said card;

Said plastic material is brought locally to its softening temperature at the location at which said module is to be placed; and Simultaneously, said module is applied with pressure on one side of said card at said softened location to embed said module in said material until said electronic module is placed in the thickness of said card and said contact areas are substantially flush with said side of card.

Preferably, the electronic module itself is heated so that it can, in turn, locally heat the plastic material by contact, thereby bringing about its softening.

The use of the module itself as a punch, on the one hand, and the local softening of the plastic material of the card, on the other hand, make it possible to eliminate some of the operations mentioned above, and in particular the preparation of a cavity having the general form of the module, the insertion and bonding of the module in the cavity, the closing of the cavity and the routing of the card.

Another object of the invention is to provide a memory card made according to the above-described method.

The card according to the invention includes, in a sheet of plastic material, an integrated circuit mounted on one side of an insulating substrate having metal-plated contact areas at the level of the surface of said sheet, said areas being placed on the side of the substrate opposite the one on which the circuit is mounted and are connected to the terminals of the circuit by a connection network through the plated-through holes of the substrate, said integrated circuit and its connection network being embedded in a coating material, the card being characterized in that the sheet of plastic material has a recess formed at least partially by the embedding of said module in the card and in that said substrate is provided with orifices at least partially filled with said plastic material forming said sheet.

Preferably, the electrical link with the contact areas is obtained by the metal plating of the wall of at least some of said orifices.

BRIEF DESCRIPTION OF DRAWINGS

The invention will be better understood in reference to the following description and the appended drawings in which:

FIGS. 6 to 10 illustrate the different steps in a variant of the embodiment of the electronic module, FIG. 6 representing a top view of a strip of insulating substrate, FIGS. 7 to 9 representing a vertical section of the successive steps in the placement of the integrated circuit on the substrate.

DETAILED DESCRIPTION OF THE PREFERRED EMBODIMENTS OF THE INVENTION

Figure 1:
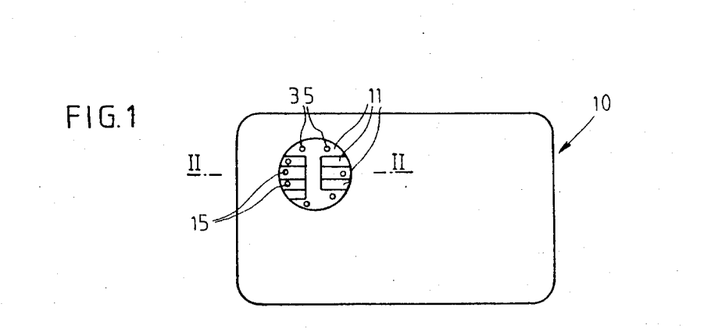
FIG. 1 represents a card obtained by a first embodiment of the method according to the invention.
Figure 2:
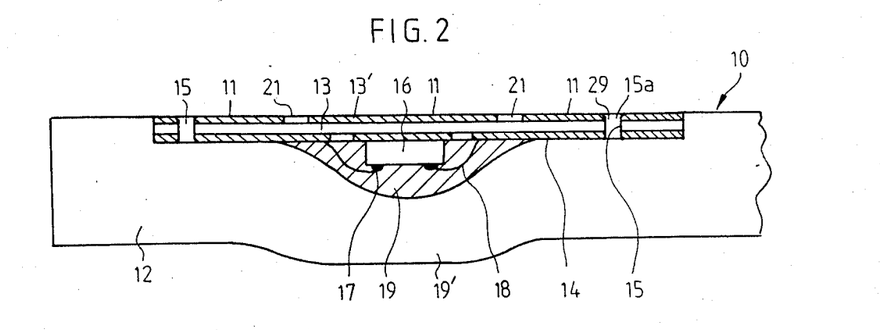
FIG. 2 is a cross-sectional view to a larger scale along line II—II of FIG. 1, corresponding to a first embodiment of the invention.

FIGS. 1 and 2, show a memory card 10 made in accordance with the first embodiment of the method of the invention. The upper side of the card 10, seen in FIG. 1, has a series of metallic areas 11 located in the upper left-hand corner and designed to provide an electrical link between the electronic circuit enclosed in the card and an apparatus for data handling and exchange. The card is made up of a single sheet 12 of flexible plastic material, for example polyvinyl chloride (PVC) of standard dimensions. The areas 11 are obtained by the metal plating provided on the side 13' of an electrically insulating substrate 13, for example in polyimide, polyester or glass-epoxy. The lower side of the substrate 13 also has conducting zones 14 corresponding to the areas 11 and also obtained by an initial metal plating. The areas 11 and the conducting zones 14 are preferably connected electrically through plated-through holes 15 going through the entire thickness of the insulating substrate but whose central part is not plated. The substrate 13 serves as a support for an integrated circuit chip 16 which is mounted, for example by bonding, on the substrate on its side opposite the side on which the contact terminals 17 of the circuit are located. The terminals 17 are connected to the conducting zones 14 by a connection network 18.

This assembly forms an electronic module 20. The integrated circuit chip 16 and its connection network 18 are embedded in a coating of electrically insulating material 19 having a thickness smaller than that of the sheet 12, for example an epoxy resin H7 OE of the EPOTECNI type which is polymerized at 100° C. after about an hour.

Thus, the coating acts not only as an electrical insulator but also provides overall strengthening and, through its drop-shaped external form, facilitates the embedding of the electronic module in the plastic material.

This material, unlike those customarily made, is not a flexible and elastic material, but a rigid material. The circuit 16 is thus electrically accessible through the contact areas 11, the plated-through holes 15, the plated zones 14 and the connections of the network 18. It is to be noted that the holes 15 are plated only on their wall and that their interior is filled with the PVC of the sheet 12 as will be explained later on. This helps to form an anchoring of the substrate 13 in the sheet 12.

The manufacturing method making it possible to obtain a card according to the structure described in FIGS. 1 and 2 is the following: using a substrate 13 which is plated on both sides, for example by rolling and/or electrolytic depositing of metal, the zones 11 and 14 are made with their desired configuration by photoengraving. The holes 15 are pierced and plated in the usual manner.

Figure 3:
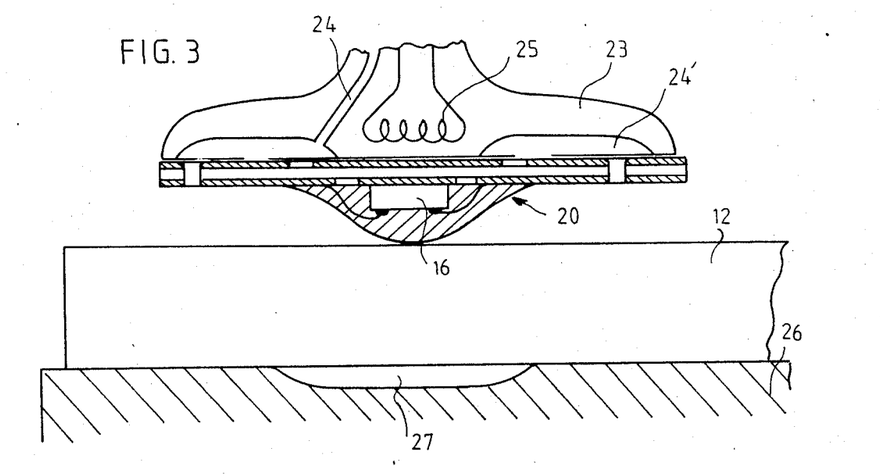
FIG. 3 represents schematically the module placement phase according to the first embodiment of the method of the invention.

In addition, the end 15a of each orifice 15 is flared. This can be achieved by providing spot facing in the metal plating layer around the end of the orifice. The integrated circuit 16 is then placed against one of the sides of the substrate 13 and its connections 18 are soldered on the conducting zones 14. Then, on the chip 16, is placed the coating material 19, such as a drop of hard epoxy glue, which is left to harden for 1 hour at a temperature of the order of 100° C. The electronic module 20 thus obtained, shown in FIG. 3, is sufficiently rigid after hardening to enable its placement in the card. The substrate 13 is in fact made of glass-epoxy and the major part of its two sides is plated except for thin nonconducting lines 21 separating the different conducting zones 11 and 14. The metal platings, each having a thickness of about 35 microns, substantially rigidify the insulating substrate which has a thickness of the order of 100 microns. With the suitably hardened coating material, the substrate forms a rigid assembly capable of acting as a punch.

According to the first embodiment illustrated in FIGS. 2 and 3, the electronic module is held preferably by a depression tool indicated by the reference 23. The module is held by the tool 23 thanks to a suction system represented by the line 24 leading into the cavity 24' of the tool. The dimensions of the tool are such that the holes 15 of the electronic module are opposite the cavity 24'. Moreover, the tool 23 is provided with heating means represented by the resistor 25.

The sheet 12 forming the support of the card is placed on a frame 26 provided with a slight hollow 27. The sheet 12 is placed such that the zone of the sheet 12 on which the electronic module is to be embedded is over the hollow 27. The heating system 25 is supplied to bring the electronic module to a temperature of about 170° C. The tool 23 applies the electronic module on the upper side of the sheet 12 with a local pressure of the order of 2.10 Pa. By contact, the plastic material is brought locally to its softening temperature, i.e. about 50° C. Through the combination of pressure and local heating, the module is embedded until the areas 11 are substantially flush with the upper side of the sheet 12. The flow of the plastic material under the effect of the insertion of the electronic module leads to the filling of the orifices 15, this filling being further favored by a suction effect produced by the tool 23. The remaining deformation of the plastic material by flowing is located in the hollow 27 of the frame 26. Then, while the plastic material is still in the softened state, the suction is removed and is replaced by a slight overpressure. This has the effect of "flattening" or driving back the upper end of the risers 29 of plastic material in the orifices 15 so that they fill the flared parts 15a. Thus, the risers 29 act as rivets ensuring at least partial anchoring of the electronic module in the sheet 12.

It should be added that, as the flow of the plastic material is localized at 19' by the hollow 27, the external dimensions of the card are modified only in this zone, and the final operation for the routing of the card becomes unnecessary.

To further improve the anchoring of the electronic module in the card, it is possible to provide in the insulating substrate 13 additional orifices such as 35 of FIG. 1 which have no electrical connection function and which are thus not metal plated. These additional orifices can in particular be provided near the periphery of the substrate in the zones not having orifices 15 for the electrical linking.

In mass production, the operations for the soldering or connections and the coating of the integrated circuit chips can be carried out advantageously on substrate film moving step by step and on which have been prepared, at regular intervals, groups of conducting zones and plated-through holes according to the desired configuration. An operation for the cutting out of the module from the film must then precede the operation for placement on the cards.

Figure 4:
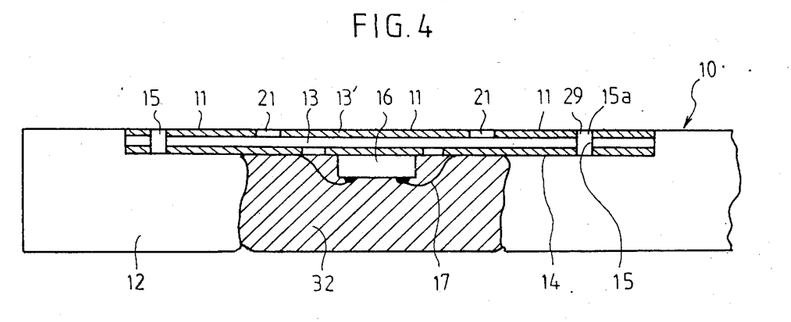
FIGS. 4 and 5 illustrate the different steps in a variant of the method according to the invention.
Figure 5:
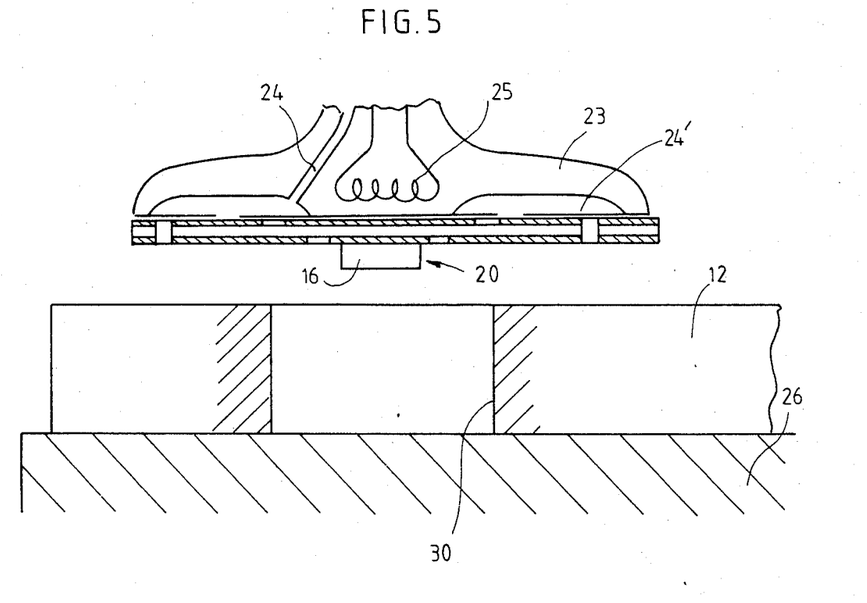

FIGS. 4 and 5 illustrate a variant of the placement of the electronic module in the sheet 12 of plastic material.

As can be seen better in FIG. 4, one begins with an electronic module made up of an insulating substrate 13 identical to the one of FIG. 2 or 3, on one side of which is fixed the integrated circuit 16.

It is to be observed that the connections 18 of FIG. 2 are not made and that there is thus no coating 19. In addition, in the sheet 12 has been provided an orifice 30 going completely through it. This orifice has, in cross section, dimensions smaller than those of the insulating substrate 13 but clearly larger than the integrated circuit 16.

The electronic module is placed on the upper side of the sheet so that the integrated circuit 16 penetrates into the orifice 30. Then, as already explained in connection with FIGS. 2 and 3, a certain pressure is exerted on the substrate while bringing the sheet 12 locally to its softening temperature. To accomplish this, the electronic module is held by the tool 23 already described.

By this process, the periphery of the substrate is embedded in the plastic material until the conducting areas are flush with the upper side of the sheet 12. A certain flow occurs during this operation. It should however be observed that this flow is less significant than in the first embodiment owing to the presence of the orifice 30. This flow is located in the zone left free by the orifice 30, and this has no effect on the final external form of the card. It moreover allows the plastic material to fill the orifices 15, this operation being favored by the suction due to the tool.

In the next step the electrical connections 18 are made in a known manner between the integrated circuit terminals and the metal plating. Finally, the portion of the orifice 30 not occupied by the integrated circuit is filled by means of an insulating deposit 32, for example epoxy resin.

This variant of the method has certain advantages. The placement of the electronic module does not bring about any modification in the external dimensions of the card. Moreover, the connections 18 between the integrated circuit and the metal plating is simplified. In fact, in this variant, these connections are made after the electronic module has been placed in the card. Consequently, the part to be handled for soldering these connections is limited to the card itself, and its dimensions are reduced. In the first embodiment, it is the entire strip carrying the different integrated circuits which has to be handled to solder the different connections and the length of this strip is not negligible.

From the preceding description, it is seen that, in every case, at least part of the electronic module made up of the integrated circuit and the substrate acts as a punch to cause the insertion of the electronic module in the card, the plastic material forming the card being brought locally to its softening temperature.

Figure 6:
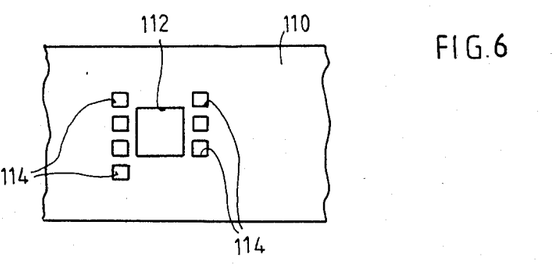

In FIG. 6 has been represented a portion of a thin strip of insulating material 110. The strip has a thickness of 120 microns, for example, and is made of an insulating material which is preferably flexible. This may be the material marketed under the name KAPTON, or an epoxy coated glass-fiber fabric. In this strip are made groups of windows of which only one is shown in FIG. 6. For each group there is a square central window 112 and peripheral windows 114. In the example considered, there are seven peripheral windows arranged along two lines located on each side of the square central window 112 and transversally in relation to the large length of the strip.

In the example described, the technique called TAB (tape automated bonding) is used to make the electronic module, i.e. several electronic modules are made on the same strip 110. It would also be possible to individually make the electronic modules from insulating supports cut out in the required dimensions.

Figure 7:
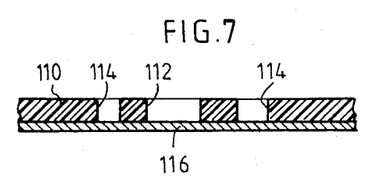

As shown in FIG. 7, one side of the insulating substrate 110 is covered with a metallic coating 116 by rolling or by any other known process. The metallic layer 116 has a thickness of the order of 30 microns for example. The layer 116 is engraved by well-known methods to define a set of electrical contact areas as will be explained later on.

Figure 8:
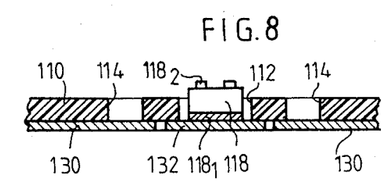

In the next phase, shown in FIG. 8, an integrated circuit chip 118 is bonded on the portion of the metal-plating layer 116 opposite the central window 112. The window 112 has, in cross section, i.e. opposite the top insulating substrate, dimensions larger than those of the integrated circuit in order to accommodate the latter. The integrated circuit 118 is bonded on the metal plating 116 by means of conducting layer of glue noted 120 in the figure. This provides an electrical connection with a relatively large area between part of the metal layer 116 and the back side $118_1$ of the integrated circuit 118, i.e. the side on which are placed the connection terminals $118_2$ of the integrated circuit 118. This solution is particularly advantageous when the integrated circuit is of N-MOS technology. Moreover, the place of connection opposite the central window 112 serves as an attachment support for the chip 118.

Figure 9:
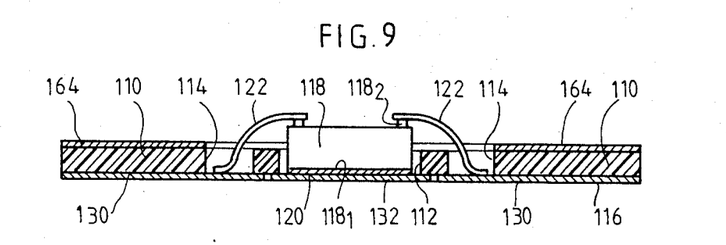

In the next phase, shown in FIG. 9, the leads, such as 122, are placed. A first end of each lead 122 is soldered on one of the terminals $118_2$ of the integrated circuit and the other end of each lead 122 penetrates into one of the peripheral windows 114 and is soldered, for example ultrasonically, on the stripped side of the metal plating layer 116 opposite said window 114. Finally, the strip 110 of insulating material is cut out to give the module its final form, which is circular, for example as shown in FIGS. 10a and 10b.

Figure 10:
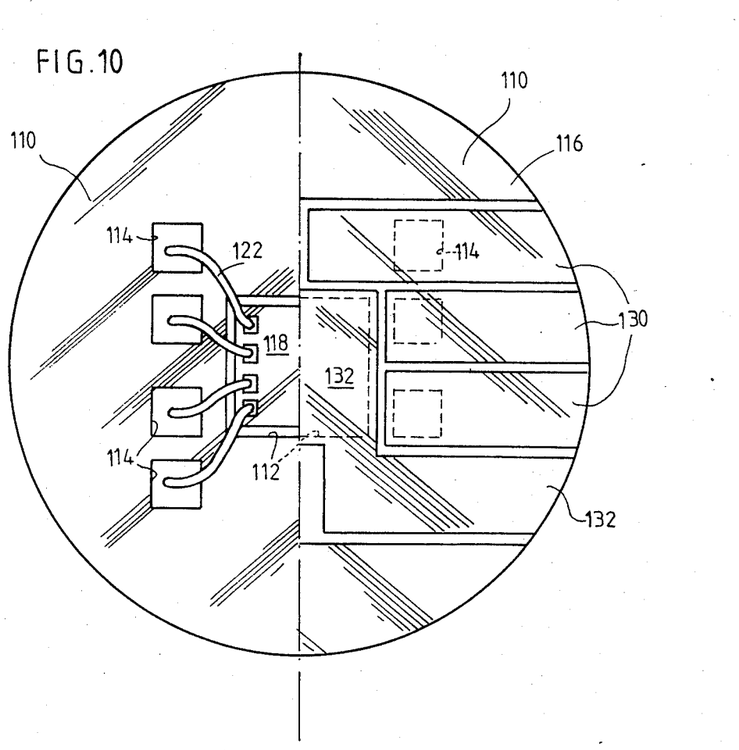
FIGS. 10a and 10b represent half-views respectively of the top and bottom of the completed electronic module.

FIG. 10b shows more precisely, in a top view, the form of the different metal-plating areas. It is seen in particular that, by engraving, metal-plating areas 130 have been defined, each associated with a respective peripheral window 114 and a metal plating 132 which is placed under the central window 112. This central metal plating 132 forms the contact area for the grounding of the electronic circuit 118.

In addition to the advantages already mentioned, the method described above makes it possible to reduce the total thickness of the electronic module since the semiconductor chip is partially embedded in the thickness of the insulating substrate. Further, the machining operations on the insulating substrate are simple since they consist of windows going through the entire thickness of the substrate and do not require any precise relative positioning owing to the flexibility of the connection wires 122.

Figure 11:
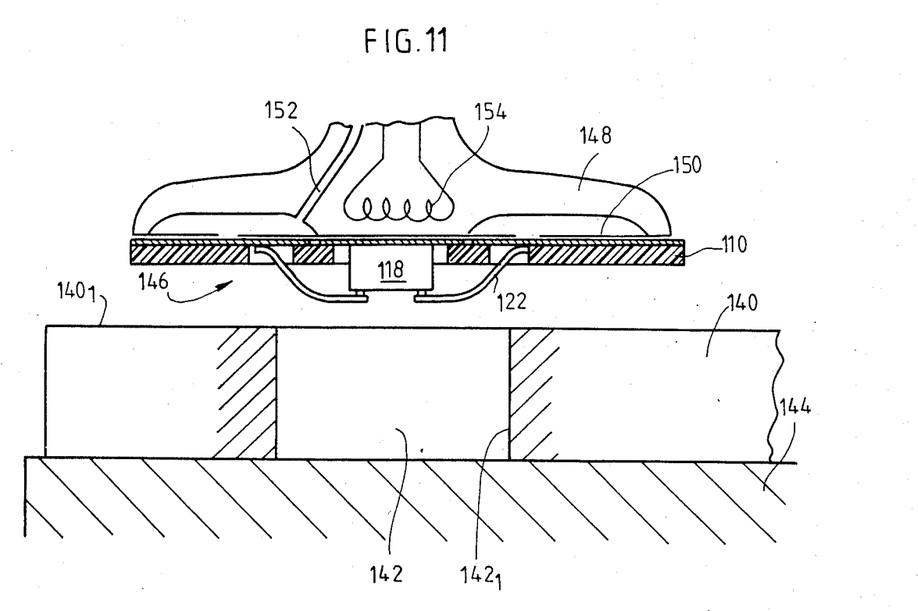
FIG. 11 illustrates, in a vertical section, the placement of the electronic module of FIGS. 4 and 5 in the body of the card.
Figure 12:
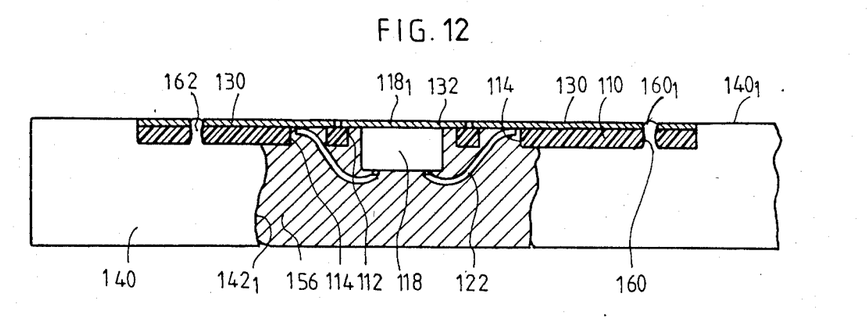
FIG. 12 represents, in a vertical section, the electronic module placed in the body of the card.

Referring now to FIGS. 11 and 12, we shall explain the method for placing the electronic module thus obtained in the body of the card.

Figure 13:
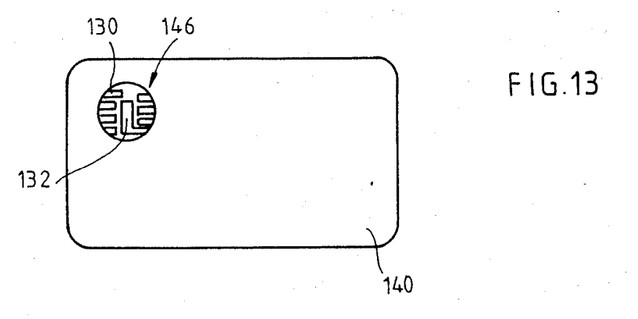
FIG. 13 shows, in a top view, a card in which the electronic module of FIGS. 4 and 5 has been placed.

As can be seen better in FIG. 13, the card is made up essentially of a body in plastic material, for example PVC, having a general rectangular form and whose thickness is, for example, 0.762 mm. During a first phase, as shown in FIG. 12, in the body of the card is drilled an orifice 142, cylindrical for example, whose section parallel to the plane of the card is greater than the surface of the zone occupied by the windows 112 and 114 made in the insulating substrate 110, but smaller than the total surface of the insulating support 110. The card 140 is placed on a heat-insulating frame 144. For its installation, the electronic module, which has the general reference 146 in FIG. 11, is held by a tool 148 which acts on the side of the electronic module carrying the contact areas 130. For example, the tool is of the depression type, i.e. a certain vacuum is made by means of a vacuum pump in a cavity 150 of the tool closed by the insulating substrate of the electronic module 146. The reference 152 represents a line designed to be connected to the vacuum pump and leading into the hollow 150. By means of the tool 148, the electronic module is seized and placed on a location $140_1$ of the upper side of the body of the card 140 around the orifice 142 such that the chip 118 penetrates into the orifice 142 along with the leads 122.

To place the module 146 in the body of the card, a certain pressure, of the order of $2.10^5$ Pa for example, is exerted on the module while heating locally the plastic material forming the body of the card in the zone in which the insulating substrate is to be penetrated. Preferably, to carry out this local heating, the tool 148 is equipped with heating means represented by the heating resistor 154. Thus, by contact between the electronic module and the plastic material forming the card, the plastic material is softened locally in the contact zone. Since the softening temperature is of the order of 50° C., the electronic module is itself brought to a temperature of the order of 170° C. Under the combined effect of softening and of the pressure exerted by the tool 148, the periphery of the insulating substrate of the module 146 acts like a punch to penetrate into the plastic material. The application of pressure is stopped when the contact areas 130 and 132 of the electronic module are flush with the upper side of the body of the card at the location $140_1$. During the sinking of the periphery of the insulating substrate, the plastic material forming the body of the card is partially driven back to deform the wall of the orifice 142. In FIG. 12 has been represented the wall $142_1$ of the deformed orifice 142 after the driving back of the plastic material. Thus, the deformation does not extend up to the external edges of the card and consequently does not affect the external dimensional characteristics of the card which are standard. Then, as shown in FIG. 12, the orifice 142, or at least the part which is not occupied by the electronic module 146, is filled with an insulating epoxy resin 156. During this operation, it is seen that the contact areas 130 and 132, in filling the windows 112 and 114, also serve to prevent that the epoxy resin does not rise over the level of the upper side of the body of the card.

According to a variant of the method, the electronic module can be made as described above, but the leads 122 are not placed. The module thus made is placed in the body of the card. Then, through the orifice 142, the leads 122 are soldered on the terminals of the chip and on the contact areas opposite the peripheral windows. Finally, the orifice 142 is filled with the insulating epoxy resin 156.

In certain cases, it may be useful to improve further the link between the periphery of the electronic module 146 and the body of the card.

A first solution, represented in FIG. 11, consists in providing, on the periphery of the module, holes 160 which go through the insulating support 110 and the metal plating 116. These holes have a flared end $160_1$ in the metal-plating layer 116. During the placement of the electronic module in the body of the card, the softened plastic material rises into the holes 160 to form the equivalent of rivets 162. The rise of the plastic material in the holes 160 is favored by the action of the depression tool 148.

Another solution shown in FIG. 9 consists in depositing a layer of adhesive material on the unplated side of the insulating support 110 of the electronic module, outside of the zone occupied by the windows 112 and 114. This layer of material is noted 164 in FIG. 9. This adhesive material is, for example, a polyester. During the heating of the module, the layer of adhesive material is softened and adheres strongly to the plastic material forming the body of the card. This solution is especially valuable in the case where the insulating support has a surface which is not very rough. This may occur when the support is made of KAPTON.

It is important to emphasize again the advantages of the placement method according to the invention. Since it is the periphery of the insulating substrate which acts as a punch to create its own recess in the body of the card with the melting or softening of the plastic material, very good bonding is obtained between the insulating substrate of the electronic module and the body of the card. In addition, since the heating of the plastic material takes place through the electronic module itself, this heating is very localized and, as, in addition, only the periphery of the insulating substrate penetrates into the plastic material, the amount of material driven out is very small. This leads to only a deformation of the wall $142_1$ of the orifice 142 provided in the card. Finally, this deformation of the internal wall of the orifice 142 allows a further improvement in the adherence between the epoxy resin deposit 156 and the body of the card. This makes it possible, on the whole, to obtain a very good connection between the body of the card and the electronic module, which is of course necessary so that the card thus completed can meet the mechanical bending strength requirements for such a card.

In the described examples, the electronic circuit is formed by a single semiconductor chip. It goes without saying that it is still within the scope of the invention if the electronic circuit required two chips or more. In this case, it would be sufficient to provide several central windows such as 12 or a single central window having adequate dimensions for accommodating the chips.

What is claimed is:

1. A method of manufacturing a memory card of the type including a printed circuit embedded inside a sheet of plastic material constituting the support for the card, said method comprising the steps of:
    (a) providing an electronic module which includes an insulating substrate equipped with metal-plated contact areas formed on a first side of said substrate, and mounting an electrical circuit on a second side of said substrate, said module having a thickness smaller than the thickness of said sheet;
    (b) locally heating said plastic material to its softening temperature at the location at which said module is to be embedded; and
    (c) simultaneously with step (b), applying pressure to said module on one side of said sheet at said location to embed said module in said plastic material until said electronic module is placed in the thickness of said sheet and said contact areas are substantially flush with said side of said sheet.

2. The method of claim 1 wherein step (a) further includes the steps of mounting said electrical circuit on said substrate said substrate also including metal platings on said second side; electrically connecting the terminals of said electrical circuit to said metal platings; coating the electrical circuit and its network of connections with an electrically insulating coating with a thickness such that the thickness of the electronic module formed by the substrate and the coating is less than the thickness of the sheet; and allowing said coating to harden.

3. The method of claim 1 wherein, before step (b), an orifice is formed through the thickness of the sheet, the cross section of said orifice through a plane parallel to that of the sides of said sheet being greater than the surface of said electrical circuit and smaller than that of said insulating substrate, said electronic module being applied on said side of said sheet so that said electrical circuit penetrates freely into said orifice.

4. The method of claim 3 wherein said insulating substrate further includes metal platings on the second side of said substrate and, after step (c), electrical connections are made between the terminals of said electrical circuit and the metal platings of the second side of said substrate, and wherein the remaining part of said orifice is filled with an insulating material.

5. The method of claim 3 wherein said electronic module is further formed with orifices going through said insulating substrate outside of the area of said electrical circuit and wherein, during step (c), said plastic material is made to penetrate into said orifices to ensure at least partial fixing of said module in said plastic material.

6. The method of claim 5 wherein in step (a) the internal wall of at least some of said orifices made in said insulating substrate is covered with a conducting coating to provide an electrical connection between said contact areas and said metal platings on said second side of said insulating substrate.

7. The method of claim 2 wherein said coating material is an epoxy resin.

8. The method of claim 1 wherein in step (b) the electronic module is heated, to bring said plastic material locally to its softening temperature.

9. A memory card comprising a sheet of plastic material forming the support for the card, an electronic module including an electrical circuit mounted on one side of an insulating substrate having metal-plated contact areas at the level of the surface of said sheet, said contact areas being placed on the side of the substrate opposite the one on which the electrical circuit is mounted, said contact areas further being connected to the terminals of the electrical circuit by a connection network, said sheet of plastic material having a recess formed at least partially by the embedding of said module in said sheet, said insulating substrate comprising a plurality of orifices at least partially filled with the plastic material forming said sheet.

10. The memory card of claim 9 wherein a wall of at least some of said orifices is metal-plated to electrically connect said contact areas to said network of connections.

11. The memory card of claim 9 wherein the end of the orifices turned toward said electrical circuit is flared so that the plastic material filling said orifices acts as a rivet.

12. A memory card comprising:
a plastic material support having two substantially parallel faces and an orifice going through the whole thickness of said support from one of said faces to the other;
an electronic module comprising an insulating substrate provided with a central window and peripheral windows and electrical contact areas located on one of said faces of the substrate, said contact areas being accessible from one face of said support, an electrical circuit at least partially located within said central window said electrical circuit having terminals, and a plurality of electrical connections, each connection having a first end connected with one of said terminals and a second end penetrating one of said peripheral windows and connected with one of said electrical contact areas, said electrical circuit freely penetrating within said orifice of said card support; and
insulating material filling said orifice of the support, the portion of the central window which is not occupied by the electrical circuit, and said peripheral windows, whereby said electrical circuit and said electrical connections are embedded within said insulating material.

* * * * *